United States Patent
Oka et al.

(10) Patent No.: US 7,879,684 B2
(45) Date of Patent: Feb. 1, 2011

(54) METHOD FOR MANUFACTURING SEMICONDUCTOR LIGHT-EMITTING ELEMENT

(75) Inventors: Takafumi Oka, Tokyo (JP); Masatsugu Kusunoki, Tokyo (JP); Shinji Abe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/711,316

(22) Filed: Feb. 24, 2010

(65) Prior Publication Data

US 2010/0219438 A1     Sep. 2, 2010

(30) Foreign Application Priority Data

Mar. 2, 2009   (JP) ............................. 2009-048082

(51) Int. Cl.
*H01L 21/00* (2006.01)

(52) U.S. Cl. ........................ 438/424; 438/597; 257/79

(58) Field of Classification Search ............... None
See application file for complete search history.

(56) References Cited

U.S. PATENT DOCUMENTS

| | | | | |
|---|---|---|---|---|
| 5,202,286 | A | * | 4/1993 | Nakatani ..................... 438/424 |
| 5,445,979 | A | * | 8/1995 | Hirano ........................ 438/167 |
| 5,888,892 | A | * | 3/1999 | Yanagida ..................... 438/614 |
| 6,171,876 | B1 | * | 1/2001 | Yuang et al. ................. 438/22 |
| 7,585,688 | B2 | | 9/2009 | Oka et al. |
| 2008/0233668 | A1 | * | 9/2008 | Abe ............................. 438/31 |

FOREIGN PATENT DOCUMENTS

| | | |
|---|---|---|
| JP | 8-130343 A | 5/1996 |
| JP | 11-273024 A | 10/1999 |
| JP | 2008-98349 A | 4/2008 |
| JP | 2008-251683 A | 10/2008 |

* cited by examiner

*Primary Examiner*—Jarrett J Stark
*Assistant Examiner*—Nicholas Tobergte
(74) *Attorney, Agent, or Firm*—Leydig, Voit & Mayer, Ltd.

(57) ABSTRACT

A semiconductor light-emitting device comprises: a semiconductor substrate; a semiconductor layer structure on the semiconductor substrate, including an active layer and a waveguide ridge; an electrode in contact with all of a top surface of the waveguide ridge; and an insulating film coating side faces of the waveguide ridge, side faces of the electrode, and ends, but not a center portion, of an upper face of the electrode.

5 Claims, 6 Drawing Sheets

METHOD FOR MANUFACTURING SEMICONDUCTOR LIGHT-EMITTING ELEMENT

BACKGROUND OF THE INVENTION

1. Field of the Invention

The present invention relates to A semiconductor light-emitting element of a waveguide ridge type and a method for manufacturing the same, and more specifically to a semiconductor light-emitting element that can reduce the operating voltage, and can prevent the electrode from being peeled off, and a method that can easily fabricate such a semiconductor light-emitting element.

2. Background Art

A semiconductor light-emitting element of a waveguide ridge type is equipped with an insulating film that coats the side faces of the waveguide ridge, and a p-side electrode that contacts the top of the waveguide ridge (for example, refer to Japanese Patent Laid-Open No. 2008-251683).

SUMMARY OF THE INVENTION

Since the p-side electrode contains Pd for lowering the contact resistance with the semiconductor layer, the adhesiveness with the $SiO_2$ film to be used as an insulating film is poor. Conventionally, however, since the p-side electrode was formed after forming an insulating film for coating the side faces of the waveguide ridge, the p-side electrode was formed on the $SiO_2$ film having poor adhesiveness. Therefore, there was a problem wherein the p-side electrode was easily peeled off. Further, if an opening was formed in the insulating film on the top of the waveguide ridge by a lift-off process, the insulating film was left on both ends of the top of the waveguide ridge. For these reasons, the p-side electrode contacted only the center portion of the top of the waveguide ridge, and the contact areas of both were small. Therefore, there was another problem wherein the operating voltage was high.

To solve the problems described above, it is the first object of the present invention to provide a semiconductor light-emitting element that can reduce the operating voltage, and can prevent the electrode from being peeled off. The second object of the present invention is to provide a method that can easily fabricate such a semiconductor light-emitting element.

According to a first aspect of the present invention, a semiconductor light-emitting device comprises: a semiconductor substrate; a semiconductor layer on the semiconductor substrate, including an active layer and a waveguide ridge; an electrode in contact with an entire surface of a top of the waveguide ridge; and an insulator film coating side faces of the waveguide ridge, side faces of the electrode, and both end portions of an upper face of the electrode, wherein a center portion of the upper face of the electrode is not coated by the insulator film.

According to a second aspect of the present invention, a method for manufacturing a semiconductor light-emitting device comprising: forming a semiconductor layer including an active layer on a semiconductor substrate; forming an electrode on an entire surface of the semiconductor layer; forming an image reversal resist of an overhang shape on the electrode; patterning the electrode by an etching using the image reversal resist as a mask so that a center portion of an upper face of the patterned electrode is coated with the image reversal resist, and spaces are present between both ends of the upper face of the patterned electrode and overhang portions of the image reversal resist; forming a waveguide ridge in the semiconductor layer by an etching using the image reversal resist and the patterned electrode as masks; forming an insulator film coating an upper face of the image reversal resist, side faces of the waveguide ridge, and side faces of the electrode; and removing the insulator film formed on the image reversal resist by a liftoff method.

Thus, the first aspect of the present invention provides a semiconductor light-emitting element that can reduce the operating voltage, and can prevent the electrode from being peeled off. The second aspect of the present invention provides a method that can easily fabricate such a semiconductor light-emitting element.

Other and further objects, features and advantages of the invention will appear more fully from the following description.

DETAILED DESCRIPTION OF THE PREFERRED EMBODIMENTS

Figure 1:
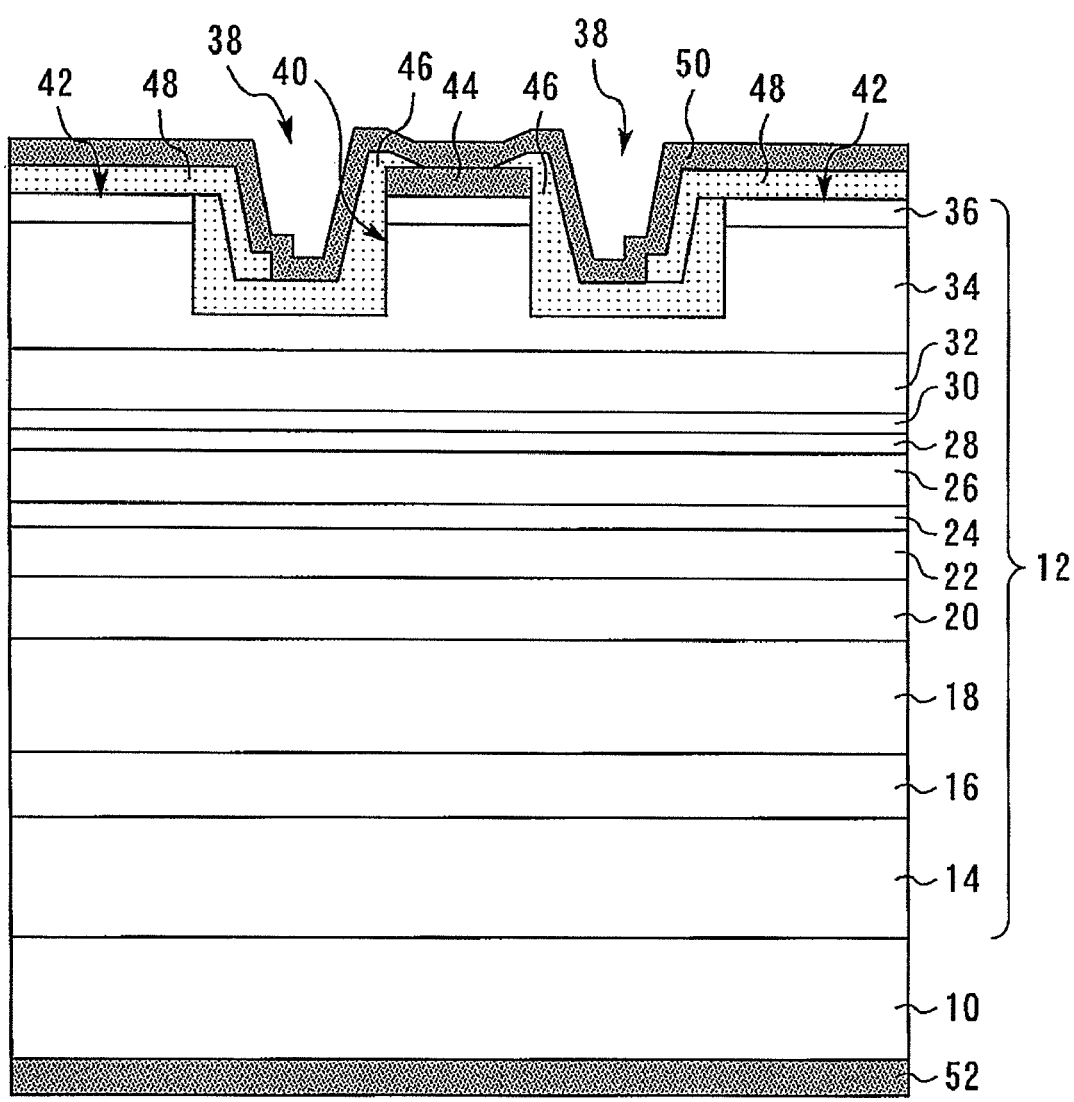
FIG. 1 is a sectional view showing a semiconductor light-emitting element according to the embodiment of the present invention.

FIG. 1 is a sectional view showing a semiconductor light-emitting element according to the embodiment of the present invention. This semiconductor light-emitting element is a blue-violet laser diode of a waveguide ridge type.

On an n-type GaN substrate 10, are sequentially laminated as a semiconductor layer 12 an n-type GaN buffer layer 14 having a thickness of 1 μm, an n-type $Al_{0.07}Ga_{0.93}N$ clad layer 16 having a thickness of 400 nm, an n-type $Al_{0.045}Ga_{0.955}N$ clad layer 18 having a thickness of 1000 nm, an n-type $Al_{0.015}Ga_{0.985}N$ clad layer 20 having a thickness of 300 nm, an n-type GaN light-guiding layer 22 having a thickness of 80 nm, an n-side SCH (Separate Confinement Heterostructure) layer 24 formed of $In_{0.02}Ga_{0.98}N$ having a thickness of 30 nm, an active layer 26, a p-side SCH layer 28 formed of $In_{0.02}Ga_{0.98}N$ having a thickness of 30 nm, a p-type $Al_{0.2}Ga_{0.8}N$ electronic barrier layer 30 having a thickness of 20 nm, a p-type GaN light-guiding layer 32 having a thickness of 100 nm, a p-type $Al_{0.07}Ga_{0.93}N$ clad layer 34 having a thickness of 500 nm, and a p-type GaN contact layer 36 having a thickness of 20 nm. Si is doped as an n-type impurity, and Mg is doped as a p-type impurity.

The active layer 26 has a double quantum well structure wherein an $In_{0.12}Ga_{0.88}N$ well layer having a thickness of 5 nm, an $In_{0.02}Ga_{0.98}N$ barrier layer having a thickness of 8 nm, and an $In_{0.12}Ga_{0.88}N$ well layer having a thickness of 5 nm are sequentially laminated.

By forming a channel 38, which is a recessed portion, in the p-type GaN contact layer 36 and the p-type $Al_{0.07}Ga_{0.93}N$ clad layer 34, a waveguide ridge 40 is formed of parts of the p-type GaN contact layer 36 and the p-type $Al_{0.07}Ga_{0.93}N$ clad layer 34. The width of the channel 38 is 10 μm. The table-like portion formed outside of the waveguide ridge 40 across the channel 38 is an electrode pad base 42.

The waveguide ridge 40 is provided on the center portion of the cleavage end faces of a laser diode in the widthwise direction, and extends between both cleavage end faces to be the resonator end faces. The dimension of the waveguide ridge 40 in the lengthwise direction, i.e., the resonator length is 1000 μm. The ridge width in the direction perpendicular to the lengthwise direction of the waveguide ridge 40 is 1 micrometer to several tens of micrometers, for example, 1.5 μm. The height of the waveguide ridge 40 from the bottom face of the channel 38 is 0.5 μm.

In contact with the entire surface of the top of the waveguide ridge 40 (upper face of the p-type GaN contact layer 36), a p-side electrode 44 in ohmic contact with the p-type GaN contact layer 36 is formed. The p-side electrode 44 contains Pd for lowering contact resistance to the p-type GaN contact layer 36, and is formed of, for example, a Pd single layer, a Pd/Ta laminate structure, or a Pd/Ta/Pd laminate structure.

Both side faces of the channel 38 including the side faces of the waveguide ridge 40 and the side faces of the electrode pad base 42, the bottom face of the channel 38, the side faces of the p-side electrode 44, and both end portions of the upper face of the p-side electrode 44 are coated with an $SiO_2$ film 46 having a thickness of 200 nm. The center portion of the upper face of the p-side electrode 44 is not coated by the $SiO_2$ film 46. The $SiO_2$ film 46 can be substituted by a film formed of $SiO_x$ (0<x<2), SiN, SiON, $TiO_2$, $Ta_2O_5$, $Al_2O_3$, AlN, $ZrO_2$, $Nb_2O_5$, MgO, SiC or the like.

Furthermore, an $SiO_2$ film 48 is provided on the upper face of the electrode pad base 42, and on a part of the surfaces of the $SiO_2$ film 46 on the side faces of the electrode pad base 42 in the channel 38 and the $SiO_2$ film 46 on the bottom face of the channel 38. The $SiO_2$ film 48 can be substituted by a film formed of $SiO_x$ (0<x<2), SiN, SiON, $TiO_2$, $Ta_2O_5$, $Al_2O_3$, AlN, $ZrO_2$, $Nb_2O_5$ or the like.

A pad electrode 50 is provided so as to contact the center portion of the upper face of the p-side electrode 44. The pad electrode 50 is placed on the $SiO_2$ film 46 and the $SiO_2$ film 48 inside the channels 38 on both sides of the waveguide ridge 40, and further extended onto the $SiO_2$ film 48 placed on the upper face of the electrode pad base 42.

On the back face of the n-type GaN substrate 10, an n-side electrode 52 wherein Ti, Pt, and Au films are sequentially laminated by a vacuum vapor deposition method is provided.

A method for fabricating a semiconductor light-emitting element according to an embodiment of the present invention will be described referring to the drawings.

Figure 2:
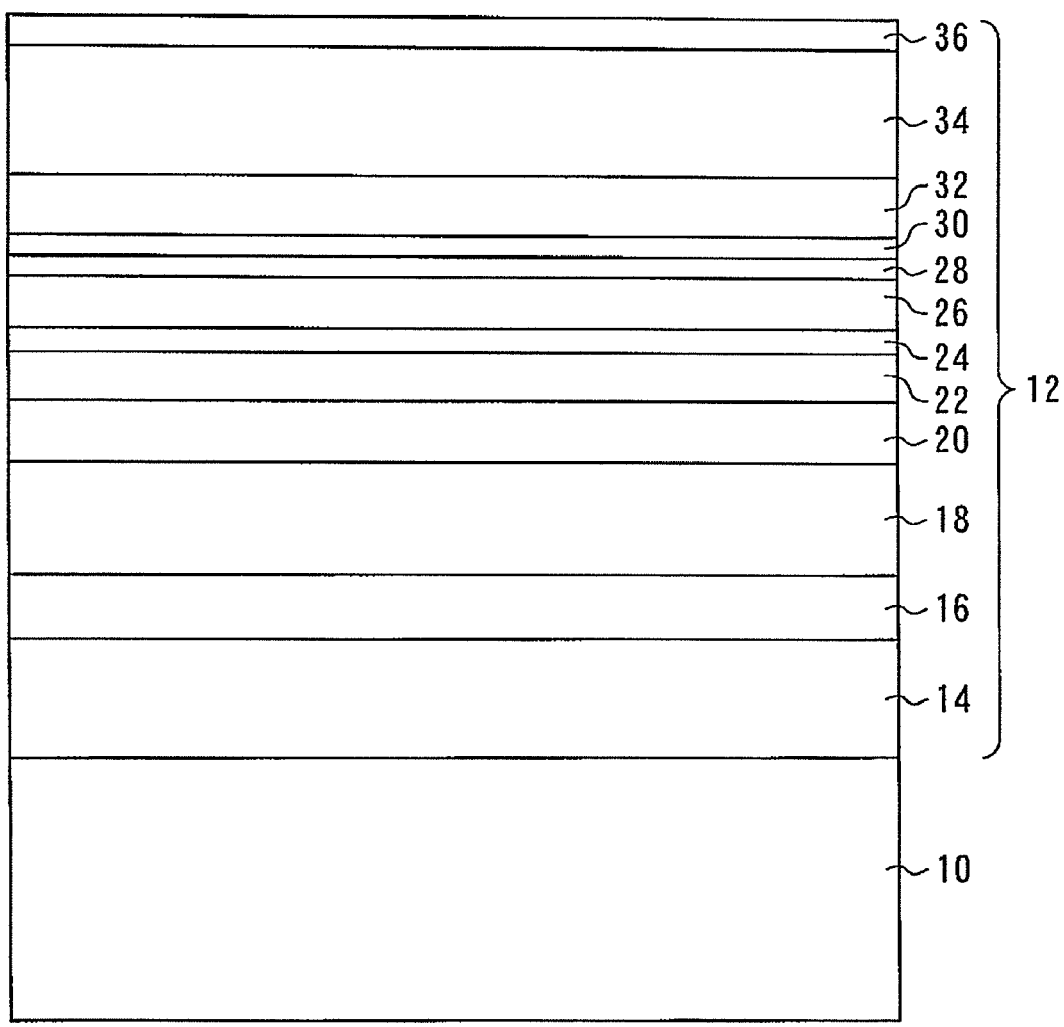
FIGS. 2-11 are sectional views for explaining a method of manufacturing a semiconductor light-emitting element according to the embodiment of the present invention.

First, as shown in FIG. 2, on an n-type GaN substrate 10 whose surface has been previously cleaned by thermal cleaning or the like, an n-type GaN buffer layer 14, an n-type $Al_{0.07}Ga_{0.93}N$ clad layer 16, an n-type $Al_{0.045}Ga_{0.955}N$ clad layer 18, an n-type $Al_{0.015}Ga_{0.985}N$ clad layer 20, an n-type GaN light-guiding layer 22, n-side SCH layer 24 formed of $In_{0.02}Ga_{0.98}N$, an active layer 26, a p-side SCH layer 28 formed of $In_{0.02}Ga_{0.98}N$, a p-type $Al_{0.2}Ga_{0.8}N$ electronic barrier layer 30, a p-type GaN light-guiding layer 32, a p-type $Al_{0.07}Ga_{0.93}N$ clad layer 34, and a p-type GaN contact layer 36 are epitaxially grown using an MOCVD method as a semiconductor layer 12. The growing temperature is, for example, 1000° C.

Figure 3:
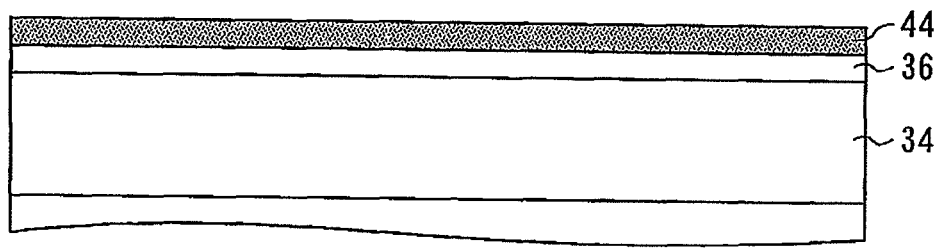
Figure 4:
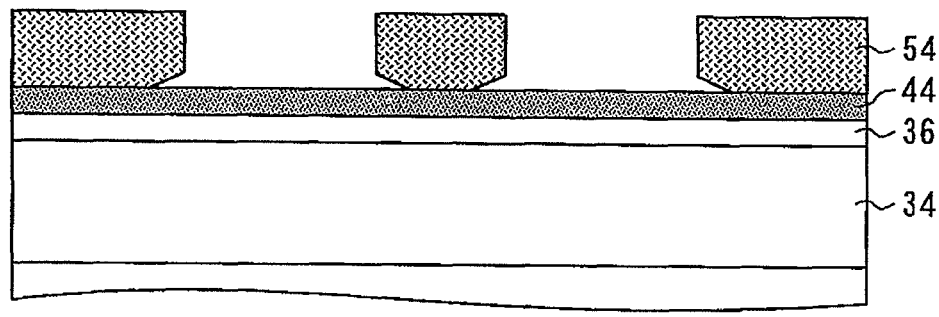

Next, as shown in FIG. 3, a p-side electrode 44 is formed on the entire surface of the p-type GaN contact layer 36. Next, an image reversal resist 54 is applied onto the entire surface of the p-side electrode 44 using a spin coating method. Then, as shown in FIG. 4, the image reversal resist 54 is left on the area corresponding to the shape of the waveguide ridge 40, and the image reversal resist 54 on the area corresponding to the shape of the channel 38 is removed using a photoengraving process. Thereby, the image reversal resist 54 of an overhang shape (both ends of the lower face are reversely tapered) is formed on the p-side electrode 44. As the image reversal resist 54, for example, a product of AZ Electronic Materials is used. This resist is a positive resist, and the heat resistant temperature thereof is 150° C.

Figure 5:
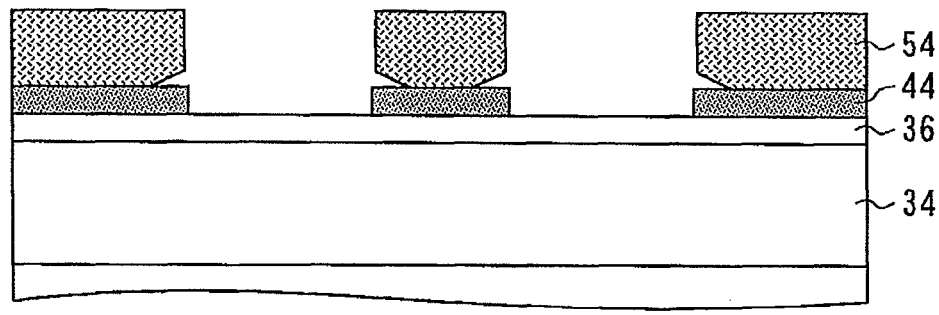

Next, as shown in FIG. 5, the p-side electrode 44 is patterned by an anisotropic etching using the image reversal resist 54 as a mask. Thereby, the state wherein the center portion of the upper face of the patterned p-side electrode 44 is coated with the image reversal resist 54, and spaces are present between both ends of the upper face of the patterned p-side electrode 44 and the overhang portions of the image reversal resist 54 is produced.

Figure 6:
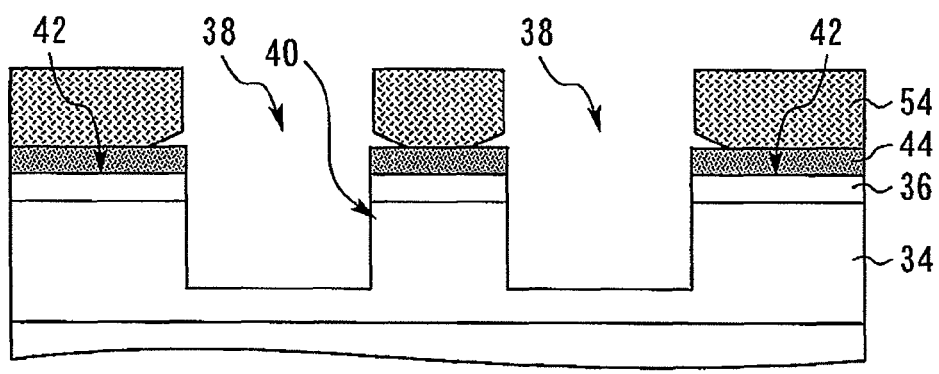

Next, as shown in FIG. 6, part of p-type GaN contact layer 36 and p-type $Al_{0.07}Ga_{0.93}N$ clad layer 34 are evenly etched from the surface of the p-type GaN contact layer 36 to form the channel 38 by RIE (reactive ion etching) using the image reversal resist 54 and the patterned p-side electrode 44 as masks. The etching depth is 500 nm. By forming the channel 38, the waveguide ridge 40 and the electrode pad base 42 are also formed. The etching for forming the channel 38 may be simultaneously performed with the etching of the p-side electrode 44.

Figure 7:
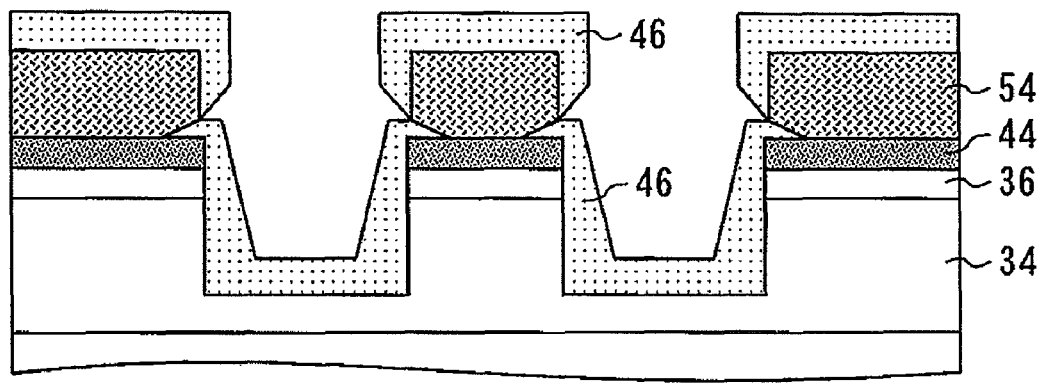

Next, as shown in FIG. 7, an $SiO_2$ film 46 having a thickness of 200 nm is formed on the entire surface by a vapor deposition method, a plasma CVD method, a sputtering method or the like. Particularly, vapor deposition, which little damages the image reversal resist 54, is preferable. In any film forming methods, the film forming temperature should be lower than the heat resistant temperature of the image reversal resist 54. The $SiO_2$ film 46 coats the upper face of the image reversal resist 54, the bottom faces and the side faces of the channel 38 (side faces of the electrode pad base 42, side faces of the waveguide ridge 40, and side faces of the p-side electrode 44) and both ends of the upper face of the p-side electrode 44. Furthermore, the $SiO_2$ film 46 has gaps at the overhang portions of the image reversal resist 54.

Figure 8:
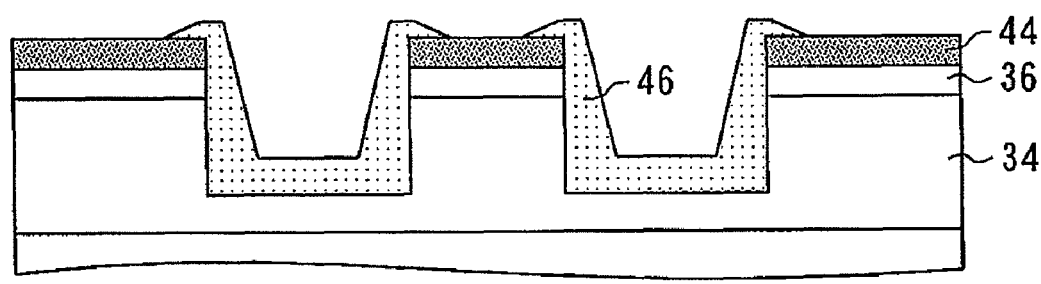

Next, as shown in FIG. 8, the image reversal resist 54 is removed by wet etching using an organic solvent, ashing using $O_2$, or wet etching using a mixed solution of sulfuric acid and hydrogen peroxide. At this time, the $SiO_2$ film 46 formed on the image reversal resist 54 is also removed by a liftoff method. Thereby, the center portion of the upper face of the p-side electrode 44 is exposed.

Figure 9:
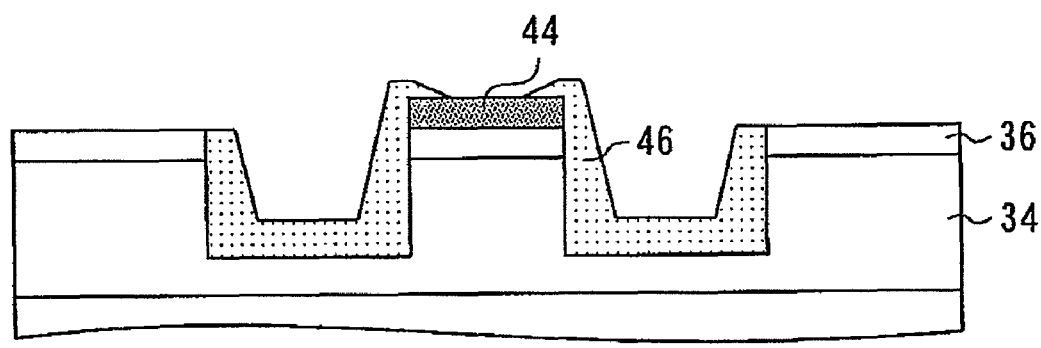

Next, by performing etching after coating the area other than the electrode pad base 42 with a resist (not shown), the $SiO_2$ film 46 and the p-side electrode 44 on the electrode pad base 42 are removed as shown in FIG. 9.

Figure 10:
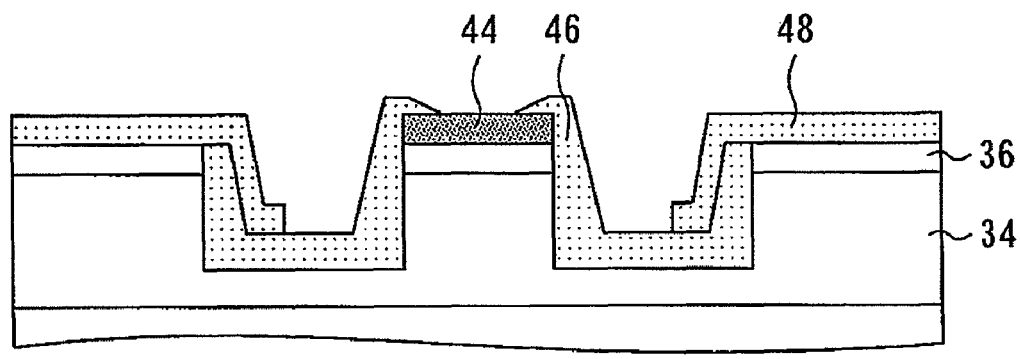

Next, a resist is applied onto the entire surface of the wafer, and a resist (not shown) having openings on the upper surface of the electrode pad base 42 and on the surface of a part of the $SiO_2$ film 46 on the side faces of the electrode pad base 42 in the channel 38 and the $SiO_2$ film 46 on the bottom portion of the channel 38 is formed using a photoengraving process. An $SiO_2$ film having a thickness of 100 nm is formed onto the entire surface of the wafer by vapor deposition. The resist and the $SiO_2$ film formed on the resist are removed by a liftoff method. Thereby, an $SiO_2$ film 48 is formed as shown in FIG. 10.

Figure 11:
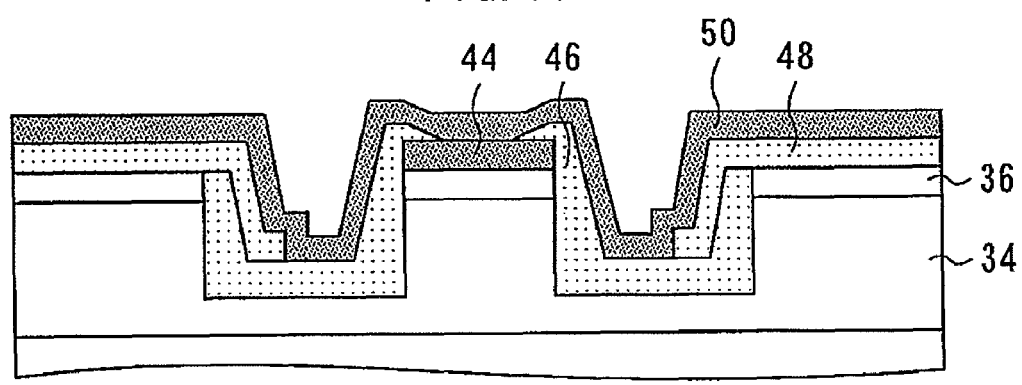

Next, as shown in FIG. 11, a Ti/Ta/Ti/Au laminate structure or a Ti/Mo/Ti/Au laminate structure is formed on the p-side electrode 44, the $SiO_2$ film 46 and the $SiO_2$ film 48 by a vacuum vapor deposition method to form a pad electrode 50.

Next, after performing back face polishing of the n-type GaN substrate 10 a n-side electrode 52 is formed on the back face of the n-type GaN substrate 10. Thereafter, the n-type GaN substrate 10 is cleaved into chips. By the above-described processes, a semiconductor light-emitting element according to the present embodiment is fabricated.

Figure 12:
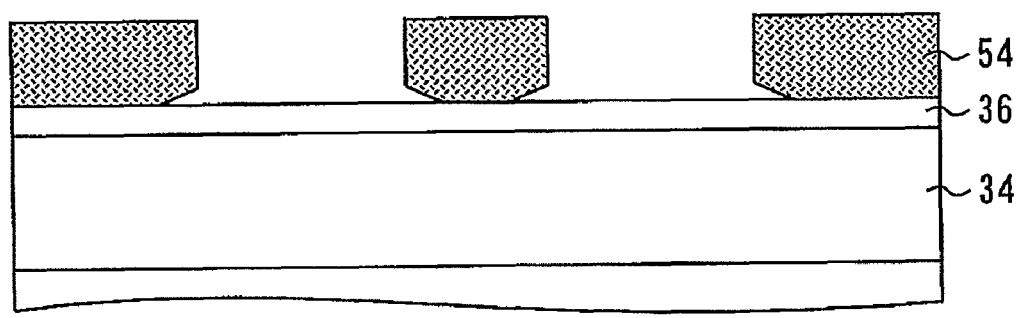
FIGS. 12-16 are sectional views for explaining a method of manufacturing a semiconductor light-emitting element according to the reference example.
Figure 13:
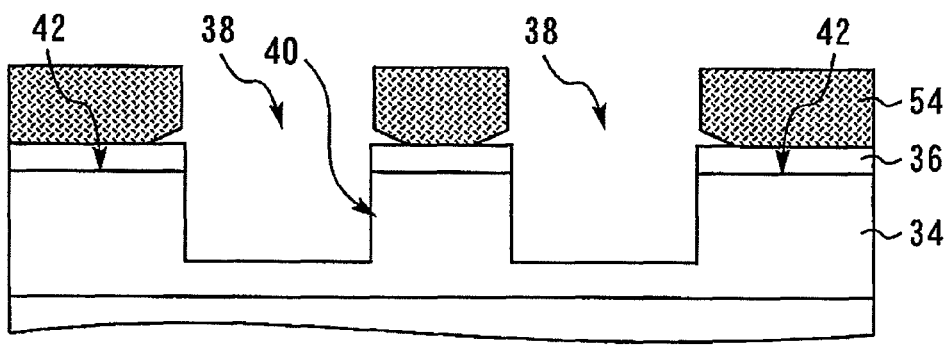
Figure 14:
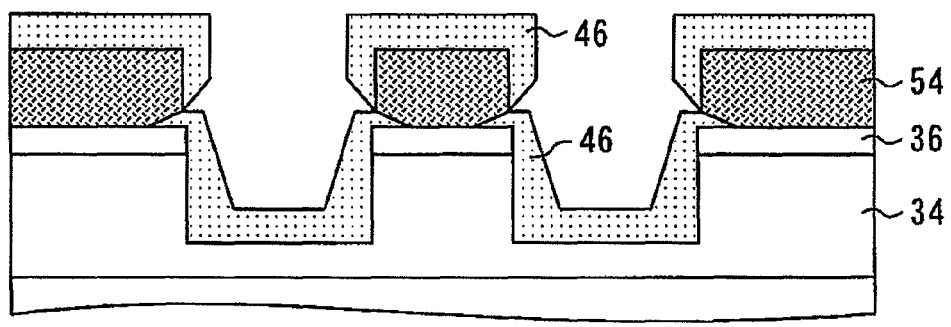
Figure 15:
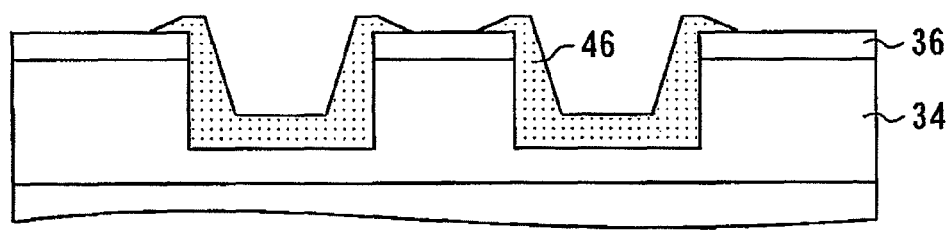
Figure 16:
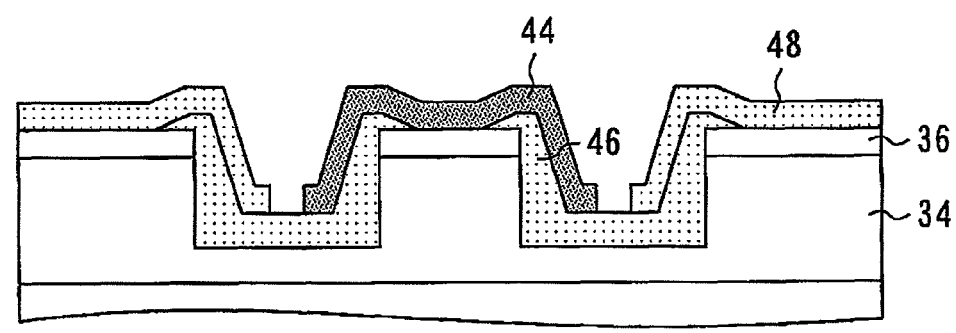

The effect of the present embodiment will be described comparing with the reference example. In the reference example, after forming the semiconductor layer 12, the image reversal resist 54 of an overhang shape is formed on the p-type GaN contact layer 36 as shown in FIG. 12. Next, as shown in FIG. 13, the waveguide ridge 40 is formed by etching using the image reversal resist 54 as a mask. Next, as shown in FIG. 14, the $SiO_2$ film 46 on the entire surface is formed. Next, as shown in FIG. 15, the $SiO_2$ film 46 formed on the image reversal resist 54 is removed by a liftoff process. Then, as shown in FIG. 16, the p-side electrode 44 and the $SiO_2$ film 48 are formed.

In a semiconductor light-emitting element according to the reference example, since the $SiO_2$ film 46 coats both end portions of the top of the waveguide ridge 40, the p-side electrode 44 contacts only the center portion of the top of the waveguide ridge 40 and the contact area of both is small. Therefore, there is a problem wherein the operating voltage is high. In addition, the p-side electrode 44 is formed on the $SiO_2$ film 46 having poor adhesiveness. Therefore, there is a problem wherein the p-side electrode 44 is easily peeled off.

Whereas, according to the present embodiment, the p-side electrode 44 contacts the entire surface of the top of the waveguide ridge 40, and the contact area between the p-side electrode 44 and the semiconductor layer 12 is large. Thereby, the operating voltage can be lowered. In addition, the p-side electrode 44 is not formed on the $SiO_2$ film 46 and directly contacts the semiconductor layer 12. Furthermore, the $SiO_2$ film 46 coats both end portions of the top of the p-side electrode 44. Thereby, the p-side electrode 44 can be prevented from peeling off.

Also according to the present embodiment, a light-emitting element that can lower the above-described operating voltage, and can prevent the electrode from peeling off, can be easily fabricated. Specifically, by forming the p-side electrode 44 on the entire surface on the semiconductor layer 12 before forming the waveguide ridge 40, a structure wherein the p-side electrode 44 is not formed on the $SiO_2$ film 46, and contacts the entire surface on the top of the waveguide ridge 40 can be easily fabricated. In addition, by using the image reversal resist 54 having an overhang shape, the $SiO_2$ film 46 that coats both end portions of the upper face of the p-side electrode 44 can be easily fabricated. Furthermore, since the p-side electrode 44 is formed in the initial stage of the fabricating process, the advantage wherein foreign matter or the like is difficult to enter in the interface between the p-side electrode 44 and the semiconductor layer 12 can be obtained.

In the above-described embodiment, although no sintering treatment is performed to achieve ohmic contact between the p-side electrode 44 and the semiconductor layer 12, sintering treatment can also be performed as required. As sintering treatment, heat treatment, for example, at 380° C. for 2 minutes, is performed. Here, if sintering treatment is performed before forming the image reversal resist 54, the attachment of foreign matter, such as the resist (organic matter) can be prevented. Also if sintering treatment is performed after performing the liftoff process, since the p-side electrode 44 is not sintered during dry etching, the etching rate is stabilized. Thereby, the height of the waveguide ridge 40 associated with the performance of the laser can be accurately controlled.

Furthermore, there may also be a case wherein if the thickness of the p-side electrode 44 is thinner than 30 nm, the resistance thereof is elevated, and the film-like shape cannot be formed. On the other hand, if the p-side electrode 44 is thicker than 170 nm, etching becomes difficult. Consequently, the thickness of the p-side electrode 44 is preferably 30 to 170 nm.

In the present embodiment, although the case wherein an electrode pad base 42 (terrace) is present was described, the electrode pad base 42 is not necessarily required. In such a case, no processes for removing the $SiO_2$ film 46 and the p-side electrode 44 on the electrode pad base 42 are required.

Also in the present embodiment, although the shape wherein the $SiO_2$ film 46 on the waveguide ridge 40 coats both end portions of the upper face of the p-side electrode 44 is formed, a shape where the $SiO_2$ film 46 does not coat both end portions of the p-side electrode 44 can also be formed depending on each condition for fabricating. Even in such a case, a semiconductor light-emitting element wherein the contact areas on the upper face of the p-side electrode 44 and the waveguide ridge 40 are secured can also be fabricated.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-048082, filed on Mar. 2, 2009 including specification, claims, drawings and summary, on which the Convention priority of the present application is based, are incorporated herein by reference in its entirety.

What is claimed is:

1. A method for manufacturing a semiconductor light-emitting device comprising:
    forming a semiconductor layer structure, including an active layer, on a semiconductor substrate;
    forming an electrode on all of a surface of the semiconductor layer structure;
    forming an image reversal resist having an overhanging shape on the electrode;
    patterning the electrode by etching, using the image reversal resist as a mask, in which a center portion of an upper face of the electrode is coated with the image reversal resist and end portions of the upper face off the electrode are not coated with the image reversal resist, between ends of the upper face of the electrode and overhanging portions of the image reversal resist;
    forming a waveguide ridge in the semiconductor layer structure by etching, using the image reversal resist and the electrode, after patterning, as masks;
    forming an insulating film coating an upper face of the image reversal resist, side faces of the waveguide ridge, and side faces of the electrode; and
    removing the insulating film on the image reversal resist by liftoff.

2. The method for manufacturing a semiconductor light-emitting device according to claim 1, wherein, in forming the insulating film, coating the ends of the upper face of the electrode with the insulating film.

3. The method for manufacturing a semiconductor light-emitting device according to claim 1, further comprising sintering to produce an ohmic contact between the electrode and the semiconductor layer structure before forming the image reversal resist.

4. The method for manufacturing a semiconductor light-emitting device according to claim 1, further comprising sintering to produce an ohmic contact between the electrode and the semiconductor layer structure after liftoff of the insulating film.

5. The method for manufacturing a semiconductor light-emitting device according to claim 1, wherein the electrode has a thickness in a range from 30 to 170 nm.

* * * * *